United States Patent
Lee et al.

(10) Patent No.: US 6,628,041 B2
(45) Date of Patent: *Sep. 30, 2003

(54) MICRO-ELECTRO-MECHANICAL-SYSTEM (MEMS) MIRROR DEVICE HAVING LARGE ANGLE OUT OF PLANE MOTION USING SHAPED COMBED FINGER ACTUATORS AND METHOD FOR FABRICATING THE SAME

(75) Inventors: Seung Bok Lee, Ithaca, NY (US); Noel MacDonald, Santa Barbara, CA (US)

(73) Assignee: Calient Networks, Inc., Goleta, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/572,979

(22) Filed: May 16, 2000

(65) Prior Publication Data

US 2003/0090172 A1 May 15, 2003

(51) Int. Cl.[7] .................................................. H02N 1/00
(52) U.S. Cl. ........................................................ 310/309
(58) Field of Search ......................................... 310/309

(56) References Cited

U.S. PATENT DOCUMENTS

| | | |
|---|---|---|
| 4,104,086 A | 8/1978 | Bondur et al. |
| 4,421,381 A | 12/1983 | Ueda et al. ................... 350/6.6 |
| 4,598,585 A | 7/1986 | Boxenhorn ................... 73/505 |
| 4,626,066 A | 12/1986 | Levinson |
| 4,654,663 A | 3/1987 | Alsenz et al. ............ 340/870.3 |
| 4,670,092 A | 6/1987 | Motamedi |
| 4,706,374 A | 11/1987 | Murakami |
| 4,784,720 A | 11/1988 | Douglas ...................... 156/643 |
| 4,855,017 A | 8/1989 | Douglas ...................... 156/643 |
| 4,922,756 A | 5/1990 | Henrion ................... 73/517 R |
| 5,016,072 A | 5/1991 | Greiff ........................... 357/26 |
| 5,068,203 A | 11/1991 | Logsdon et al. |
| 5,083,857 A | 1/1992 | Hornbeck ................... 359/291 |
| 5,095,752 A | 3/1992 | Suzuki et al. |
| 5,097,354 A | 3/1992 | Goto .......................... 359/212 |

(List continued on next page.)

FOREIGN PATENT DOCUMENTS

| | | |
|---|---|---|
| DE | 4224601 A1 | 1/1994 |
| EP | 0 834759 A2 | 4/1998 |
| EP | 1 120677 A2 | 1/2001 |
| GB | 2175705 A | 12/1986 |

(List continued on next page.)

OTHER PUBLICATIONS

Hoffmann, W., Lee, C.S., and MacDonald, N.C., Monolithic Three–Dimensional Single–Crystal Silicon Microelectromechanical Systems:, Sensors and Materials, 10, 337–350 (1998).

(List continued on next page.)

*Primary Examiner*—Mark O. Budd
(74) *Attorney, Agent, or Firm*—Blakely, Sokoloff, Taylor & Zafman LLP (57) ABSTRACT

A micro-electro-mechanical-system (MEMS) mirror device includes a mirror component that is capable of moving upon electrostatic actuation. The MEMS mirror device also includes and one or more electrostatic actuators providing electrostatic actuation. The electrostatic actuators having plates disposed approximately perpendicular to the mirror component. The plates are disposed to define a gap between the plates that decreases along a direction perpendicular to a surface of the mirror component.

11 Claims, 11 Drawing Sheets

U.S. PATENT DOCUMENTS

| | | |
|---|---|---|
| 5,172,262 A | 12/1992 | Hornbeck .................... 359/223 |
| 5,203,208 A | 4/1993 | Bernstein ...................... 73/505 |
| 5,226,321 A | 7/1993 | Varnham et al. .............. 73/505 |
| 5,235,187 A | 8/1993 | Arney et al. |
| 5,287,082 A | 2/1994 | Arney et al. |
| 5,316,979 A | 5/1994 | MacDonald et al. |
| 5,393,375 A | 2/1995 | MacDonald et al. |
| 5,397,904 A | 3/1995 | Arney et al. |
| 5,399,415 A | 3/1995 | Chen et al. |
| 5,426,070 A | 6/1995 | Shaw et al. |
| 5,428,259 A | 6/1995 | Suzuki ........................ 310/309 |
| 5,449,903 A | 9/1995 | Arney et al. |
| 5,488,862 A | 2/1996 | Neukermans et al. ..... 73/504.02 |
| 5,501,893 A | 3/1996 | Laermer et al. ............ 428/161 |
| 5,506,175 A | 4/1996 | Zhang et al. ................ 437/228 |
| 5,524,153 A | 6/1996 | Laor ............................ 385/16 |
| 5,536,988 A | 7/1996 | Zhang et al. ................ 310/309 |
| 5,563,343 A | 10/1996 | Shaw et al. |
| 5,594,820 A | 1/1997 | Garel-Jones et al. |
| 5,610,335 A | 3/1997 | Shaw et al. |
| 5,611,888 A | 3/1997 | Bosch et al. ............. 156/643.1 |
| 5,611,940 A | 3/1997 | Zettler |
| 5,628,917 A | 5/1997 | MacDonald et al. ........... 216/2 |
| 5,629,790 A | 5/1997 | Neukermans et al. ....... 359/198 |
| 5,637,189 A | 6/1997 | Peeters et al. |
| 5,642,015 A * | 6/1997 | Whitehead et al. ......... 310/309 |
| 5,645,684 A | 7/1997 | Keller |
| 5,673,139 A | 9/1997 | Johnson ...................... 359/291 |
| 5,719,073 A | 2/1998 | Shaw et al. |
| 5,726,073 A | 3/1998 | Zhang et al. ................ 437/228 |
| 5,770,465 A | 6/1998 | MacDonald et al. |
| 5,846,849 A | 12/1998 | Shaw et al. |
| 5,869,916 A | 2/1999 | Suzuki et al. ................ 310/309 |
| 5,907,425 A | 5/1999 | Dickensheets et al. |
| 5,912,608 A | 6/1999 | Asada |
| 5,920,417 A | 7/1999 | Johnson ...................... 359/223 |
| 5,923,798 A | 7/1999 | Aksyuk et al. |
| 5,960,132 A | 9/1999 | Lin |
| 5,969,848 A | 10/1999 | Lee et al. .................... 359/298 |
| 5,988,906 A | 11/1999 | Jerman et al. |
| 5,995,688 A | 11/1999 | Aksyuk et al. |
| 5,998,816 A | 12/1999 | Nakaki et al. |
| 5,998,906 A | 12/1999 | Jerman et al. ............... 310/309 |
| 6,000,280 A | 12/1999 | Miller et al. ................... 73/105 |
| 6,020,272 A | 2/2000 | Fleming ...................... 438/734 |
| 6,044,705 A | 4/2000 | Neukermans et al. |
| 6,097,858 A | 8/2000 | Laor ............................ 385/16 |
| 6,097,860 A | 8/2000 | Laor ............................ 385/17 |
| 6,101,299 A | 8/2000 | Laor ............................ 385/16 |
| 6,121,552 A | 9/2000 | Brosnihan et al. |
| 6,191,518 B1 * | 2/2001 | Suzuki ........................ 310/309 |
| 6,229,640 B1 | 5/2001 | Zhang |
| 6,239,473 B1 | 5/2001 | Adams et al. |
| 6,253,001 B1 | 6/2001 | Hoen |
| 6,329,738 B1 * | 12/2001 | Hung et al. ................. 310/309 |
| 6,333,584 B1 * | 12/2001 | Jerman et al. .............. 310/309 |
| 2001/0044165 A1 | 11/2001 | Lee et al. |

FOREIGN PATENT DOCUMENTS

| | | |
|---|---|---|
| JP | 60-107017 | 6/1985 |
| JP | 5-107485 A | 4/1993 |
| JP | Hei 6-180428 | 6/1994 |
| JP | 6-180428 | 6/1994 |
| WO | WO 94/18697 A1 | 8/1994 |
| WO | WO 97/04283 A2 | 2/1997 |
| WO | WO99/36941 | 7/1999 |
| WO | WO99/36948 | 7/1999 |
| WO | WO 01/33898 A2 | 5/2001 |
| WO | WO 01/39413 A2 | 5/2001 |

OTHER PUBLICATIONS

MacDonald, N.C., "SCREAM microelectromechanical systems", Microelectronic Engineering, 32, 49–73 (1996).

Field, L.A., et al., "Micromachined 1x2 optical fiber switch", Sensors and Actuators A, 53, 311–315 (1996).

Hornbeck, L.J. "Digital Light Processing for high–brightness, high–resolution applications", SPIE vol. 3013, San Jose, CA, pp. 27–40, Feb. 1997.

Webb, R.Y., Adams, S.G., and MacDonald, N.C., "Suspended thermal oxide trench isolation for SCS MEMS", SPIE vol. 3519, Boston, MA pp. 196–199, Nov. 1998.

Shaw, K.A., Zhang Z.L., and MacDonald, N. "SREAM1: a single mask, single–crystal silicon, reactive ion etching process for microelectromechanical structures", Sensors & Actuators A, 40, 63–70 (1994).

Ming C. Wu, "MEMS for Optical and RF Applications", Nov. 1–3, 1999, Engineering: 823.52, UCLA Extension, Department of Engineering, Information Systems, and Technical Management.

Sung Chris B. Lee, "Two–Depth, Single Crystal Silicon Microelectromechanical Systems", A Dissertation Presented to the Faculty of the Graduate School of Cornell University in Partial Fulfillment of the Requirements for the Degree of Doctor of Philosophy, 2000.

Elsevier Sequoia, "Sensors and Actuators", ISSN 09, vol. A40 No. 1, Jan. 1994.

M. Adrian Michalicek, Wenge Zhang, Kevin F. Harsh, Victor M. Bright, and Y.C. Lee, "Micromirror arrays fabricated by flip–chip assembly", Part of the SPIE Conference on Miniaturized Systems with Micro–Optics and MEMS, Santa Clara, Sep. 1999, SPIE vol. 3878, p. 68–79.

Chris Seung–Bok Lee, Sejin Han, Noel C. MacDonald, "Multiple Depth, Single Crystal Silicon MicroActuators For Large Displacement Fabricated by Deep Reactive Ion Etching", Solid–State Sensor and Actuator Workshop, Hilton Head Island, SC, Jun. 8–11, 1998, p. 45–50.

William C. Tang, Martin G. Lim, Roger T. Howe, "Electrostatic Comb Drive Levitation and Control Method", Journal of Microelectromechanical Systems, vol. 1, No. 4, 12/92, p. 170–178.

Timothy J. Broshnihan, James M. Bustillo, Albert P. Pisano & Roger T. Howe, "Embedded Interconnect & Electrical Isolation for High–Aspect–Ratio, SOI Inertial Instruments," Berkeley Sensor & Actuator Sensor, pp. 637–640, Transducers '97, 1997 International Conference on Solid–State Sensors and Actuators (Chicago, Jun. 16–19, 1997) (Jun. 16–19, 1997).

Wolfgang Kuehnel and Steven Sherman, "A Surface Micromachined Silicon Acclerometer with On–Chip Detection Circuitry," Sensors and Actuators A 45, pp. 7–16 (1994).

Howard K. Rockstad, et al., "A Miniature High–Sensitivity Broadband Accelerometer Based on Electron Tunneling Transducers," Sensors and Actuators A 43, pp. 107–114 (1994).

Lynn Michelle Roylance and James B. Angell, "A Batch–Fabricated Silicon Accelerometer," IEEE Transactions on Electron Devices, vol. Ed–26, No. 12, pp. 1911–1917 (Dec. 1979).

Toshiki Hirano, et al., "Design, Fabrication, and Operation of Submicron Gap Comb–Drive Microactuators," J. of Microelectromechanical Systems, vol. 1, No. 1, pp. 52–59, (Mar. 1992).

V.P. Jaecklin. et al., "Comb Actuators for xy–microstages," Sensors and Actuators, A, 39, pp. 83–89 (1993).

Susanne C. Arney and Noel C. MacDonald, et al., "Formation of Submicron Silicon–On–Insulator Sructures by Lateral Oxidation of Substrate–Silicon Islands," J. Vac. Sci. Technol. B vol. 6 No. 1, pp. 341–345, (Jan./Feb. 1988).

Diederick W. de Bruin, et al., "Second–Order Effects in Self–Testable Accelerometers," IC Sensors, IEEE, pp. 149–152 (1990).

Russell Y. Webb, Scott G. Adams, and Noel C. MacDonald, "Suspended Thermal Oxide Trench Isolation for SCS MEMS." SPIE vol. 3519, Boston, MA, pp. 196–199, (Nov. 1998).

Leslie A. Field, Diane L. Burriesci, Peter R. Robrish, and Richard C. Ruby, "Micromachines 1×2 Optical–Fiber Switch." Sensors and Actuators A, 53, pp. 311–315, (1996).

Mihailovich, Zhang, Shaw, MacDonald, "Single–Crystal Silicon Torsional Resonators", 0–7803–0957–2/93, 1993 IEEE, p. 184–188.

Janusz Bryzek, Kurt Petersen, & Wendell McCulley, "Micromachines on the March," IEEE Spectrum, pp. 20–31 (May 1994).

Kevin A. Shaw, et al., "SCREAM I: A Single Mask, Single–Crystal Silicon, Reactive Ion Etching Process for Microelectromechanical Structures," Sensors and Actuators A, 40 pp. 63–70 (1994).

"Lucent's New All–Optical Router Uses Bell Labs Microscopic Mirrors," Bells Labs press release, pp. 1–4, Nov. 10, 1999. http://www.bell–labs.com/news/1999/november/10/1.html.

Noel C. MacDonald, "SCREAM MicroElectroMechanical Systems." Microelectronic Engineering, 32, pp. 49–73 (1996).

Seung Chris B. Lee, "Two–Depth, Single Crystal Silicon Microelectromechanical Systems." A Dissertation Presented to the Faculty of the Graduate School of Cornell University in Partial Fulfillment of the Requirements for the Degree of Doctor of Philosophy, (Jan. 2000).

Ming C. Wu, "MEMS for Optical and RF Applications." UCLA Extension, Department of Engineering, Information Systems and Technical Management, Engineering: 823.52, Nov. 1–3, 1999.

Wolfgang Hofmann, Chris S. Lee, and Noel C. MacDonald, Monolithic Three–Dimensional Single–Crystal SIlicon Microelectromechanical Systems, Sensors and Materials, vol. 10, No. 6, pp. 337–350 (1998).

Joseph E. Ford, Vladimir A. Aksyuk, David J. Bishop, and James A. Walker, "Wavelength Add–Drop Switching Using Tilting Micromirrors," Journal of Lightwave Technology, vol. 17, No. 5, pp. 904–911 (May 1999).

Cornel Marxer and Nicolaas F. de Rooij, "Micro–Opto–Mechanical 2 x 2 Switch for Single–Mode Fibers Based on Plasma–Etched Silicon Mirror and Electrostatic Actuation," Journal of Lightwave Technology, vol. 17, No. 1, pp. 2–6 (Jan. 1999).

D.T. Neilson, V.A. Aksyuk, S. Arney, N.R. Basavanhally, K.S. Bhalla, D.J. Bishop, B.A. Boie, C.A. Bolle, J.V. Gates, A.M. Gottlieb, J.P. Hickey, N.A. Jackman, P.R. Kolodner, S.K. Korotky, B. Mikkelsen, F. Pardo, G. Raybon, R. Ruel, R.E. Scotti, T.W. Van Blarcum, L. Zhang, and C.R. Giles, "Fully Provisional 112 x 112 Micro–Mechanical Optical Crossconnect With 35.8Tb/s Demonstrated Capacity," OFC 2000 Tech. Dig., Baltimore, Maryland, pp. 202–204 (Mar. 7–10, 2000).

M.T. A. Saif and N.C. MacDonald, "Planarity of Large MEMs," Journal of Microelectromechanical Systems, vol. 5, No. 2, pp. 79–97 (Jun. 1996).

W.–H. Juan and S.W. Pang, "High–Aspect –Ratio Si Vertical Micromirror Arrays for Optical Switching," Journal of Microelectromechanical Systems, vol. 7, No. 2, pp. 207–213 (Jun. 1998).

Chris S.B. Lee, Sejin Han, and Noel C. MacDonald, "Single Crystal Silicon (SCS) XY–Stage Fabricated by DRIE and IR alignment," MEMS 2000, The Thirteenth Annual International Conference on Micro Electro Mechanical Systems, Miyazaki, Japan, pp. 28–33 (Jan. 23–27, 2000).

Chris S.B. Lee, Russell Y. Webb, John M. Chong, and Noel C. MacDonald, "Single Crystal Silicon (SCS) MicroMirror Arrays using Deep Silicon Etching and IR Alignment," MEMS 2000, The Thirteenth Annual International Conference on Micro Electro Mechanical Systems, Miyazaki, Japan, pp. 441–448 (Jan. 23–27, 2000).

Rob Legtenberg, A.W. Growneveld and M. Elwenspoek, "Comb–drive actuators for large displacements," Journal of Micromechanics and Microengineering Structures, Devices, and Systems, pp. 320–329 (Jun. 4, 1996).

A. A. Yasseen, J. Mitchell, T. Streit, D. A. Smith, and M. Mehregany, "A Rotary Electrostatic Mircomotor 1x8 Optical Switch," XP–000829143, Proceedings IEEE of the 11th Annual International Workshop on Micro Electro Mechanical Systems. An Investigation of Micro Structures, Sensors, Actuators, Machines and Systems. Heidelberg, Germany, pp. 116–120 (Jan. 25–28, 1998).

S. W. Smith, A. A. Yasseen, M. Mehregany, and F. L. Marat, "Micromotor grating optical switch," XP000520888, Optics Letters, Optical Society of America, vol. 20, No. 16, pp. 1734–1736 (Aug. 15, 1995).

S. Adams, F. Bertsch, J. Chen, J. Chong, P. Hartwell, T. Huang, T. Kudrie, C. Lee, B. Reed, R. Webb, and N. C. MacDonald, "Deep Silicon RIE with Profile Control," 44th National Symposium of the American Vaccum Society, presented by Peter G. Hartwell, 19 pages, Cornell University, Ithaca, NY 14853, (Oct. 23, 1997).

PCT Notification of Transmittal of the International Search Report or The Declaration for PCT Counterpart Application No. PCT/US01/13978 Containing International Search Report (Dec. 13, 2002).

* cited by examiner

MICRO-ELECTRO-MECHANICAL-SYSTEM (MEMS) MIRROR DEVICE HAVING LARGE ANGLE OUT OF PLANE MOTION USING SHAPED COMBED FINGER ACTUATORS AND METHOD FOR FABRICATING THE SAME

FIELD OF THE INVENTION

The present invention relates generally to the field of micro-electromechanical-system (MEMS) devices. More particularly, the present invention relates to a MEMS mirror device having large angle out of plane motion using shaped combed finger actuators and method for fabricating the same.

BACKGROUND OF THE INVENTION

A MEMS device is a mirco-sized mechanical structure having electrical circuitry fabricated using conventional integrated circuit (IC) fabrication methods. One type of MEMS device is a microscopic gimbaled mirror device. A gimbaled mirror device includes a mirror component, which is suspended off a substrate, and is able to pivot about an axis caused by electrostatic actuation. Electrostatic actuation creates an electric field that causes the mirror component to pivot. By allowing the mirror component to pivot, the mirror component is capable of having an angular range of motion in which the mirror component can redirect light beams to varying positions.

One type of electrostatic actuation for a gimbaled mirror is parallel plate actuation. Parallel plate actuation uses electrodes formed on a planar surface below a suspended mirror component. A voltage is applied to the electrodes that creates an electric field that causes the mirror component to move.

A disadvantage with parallel plate actuation for a gimbaled mirror is that the force required to move the mirror component is directly proportional to the square of the distance of the gap between the electrodes and the mirror component. As such, to obtain a large range of angular motion, the mirror component must be suspended at a large height above the electrodes, which requires a large amount of voltage to produce the necessary force for actuation. Another disadvantage with using parallel plate actuation is related to the "snap down" phenomenon. The snap down phenomenon occurs when a certain voltage level is applied to the electrodes that causes the mirror component to snap down to the floor of the substrate thereby limiting the working range of motion for the mirror device.

Another type of electrostatic actuator for a MEMS device is a combed finger actuator. A prior combed finger actuator uses fixed straight sidewall interdigitated fingers to move a straight sidewall moving part having a same height as the interdigitated fingers. Typically, the straight sidewall interdigitated fingers are fabricated using a simple photolithography and a single etch step. A voltage is applied to adjacent straight sidewall interdigitated fingers that produce an electrostatic force that causes the moving part to move. Although a small out-of-plane motion is possible by placing a ground plane and altering the net electric field in the out-of-plane direction, such prior combed finger actuators using straight sidewall interdigitated fingers and straight sidewall moving part provided only in-plane motion for the moving part.

A disadvantage with such a prior combed finger actuator is that it does not provide significant out-of-plane motion and therefore is not suitable for a MEMS mirror device. That is, a gimbaled mirror devices requires large motion in the out-of-plane direction to redirect beams of light.

Another prior electrostatic actuator for a MEMS device, which provides out-of-plane motion, uses straight sidewall interdigitated fingers and a straight sidewall moving part that is a smaller in height than the fixed interdigitated fingers. Thus, a voltage potential applied on the fixed interdigitated fingers creates an electric field that is asymmetric with respect to the moving part that causes the moving part to move in an out-of-plane motion. For such a prior electrostatic actuator, the farthest distance the moving part can move is at the equilibrium position specified in the Z-direction, which is approximately at a center position between the fixed interdigitated fingers.

A disadvantage with this type of actuator is that to move the moving part in the out-of-plane direction a large amount of voltage and force is required. That is, the magnitude of net electric field in the out-of-plane direction decreases significantly as the moving part moves in the out-of-plane direction. Thus, to move the moving part to the equilibrium position, a great amount of force and voltage is required.

SUMMARY OF THE INVENTION

A micro-electro-mechanical-system (MEMS) mirror device is disclosed. The MEMS mirror device includes a mirror component that is capable of moving upon electrostatic actuation. The MEMS mirror device also includes one or more electrostatic actuators providing electrostatic actuation. The electrostatic actuators having shaped plates disposed approximately perpendicular to the mirror component. The shaped plates are disposed to define a gap between the plates that decreases along a direction perpendicular to a surface of the mirror component.

An electrostatic actuator for a MEMS mirror device is disclosed. The electrostatic actuator includes two or more shaped fingers. The shaped fingers are configured to define a gap between the shaped fingers that decreases along a direction perpendicular to a top surface of the shaped fingers.

A MEMS mirror device fabrication method is disclosed using a single substrate. A pattern is formed on the substrate such that the pattern is used to define a frame pattern, electrostatic actuators, mirror component, and support structure. Portions of the substrate are removed selectively using the pattern to form the frame pattern, electrostatic actuators, mirror component, and support structure such that the electrostatic actuators define a gap that decreases along a direction perpendicular to a surface of the mirror component.

An electrostatic actuator fabrication method for a MEMS mirror device is disclosed. Two or more shaped fingers are formed from a single substrate. The shaped fingers are formed to define a gap between the fingers that decreases along a direction perpendicular to a top surface of the fingers so that a movable finger may move in an out-of-plane direction.

Other features and advantages of the present invention will be apparent from the accompanying drawings, and from the detailed description, which follows below.

BRIEF DESCRIPTION OF THE DRAWINGS

The present invention is illustrated by way of example and not limited in the figures of the accompanying drawings in which like references indicate similar elements and in which.

DETAILED DESCRIPTION

A micro-electro-mechanical-system (MEMS) mirror device is described that provides for large angle out-of-plane motion. The MEMS mirror device includes a mirror component that is capable of moving upon electrostatic actuation. The MEMS mirror device also includes one or more electrostatic actuators providing electrostatic actuation. The electrostatic actuators have shaped plates disposed approximately perpendicular to the mirror component. The shaped plates are disposed to define a gap between the plates that decreases along a direction perpendicular to a surface of the mirror component.

An electrostatic actuator for a MEMS mirror device is described. The electrostatic actuator includes two or more shaped fingers. The shaped fingers are configured to define a gap between the shaped fingers that decreases along a direction perpendicular to a top surface of the shaped fingers.

By having a gap between the shaped plates of the actuators decreasing along a direction perpendicular to the mirror component, an out-of-plane electric field may be created when a voltage is applied to the shaped plates because the electric field becomes greater as the gap decreases. The intensified electric field creates a stronger force at a lower voltage that can be applied to a moving part to cause a mirror component of a MEMS mirror device to pivot. Consequently, the force that can be created is inversely proportional to the size of the gap. Thus, having a smaller gap between the plates creates a larger force to move the moving part. Such an electrostatic actuator providing out-of-plane motion allows a MEMS mirror device to have large range of angular motion with respect to an axis. The range of the out-of-plane motion is significantly greater than the midpoint for actuators having interdigitated fingers that provide an equilibrium electric field at the midpoint between the fingers. For example, the MEMS mirror device described herein may have an angular range of motion of approximately 20 degrees.

A MEMS mirror device fabrication method is described using a single substrate. A pattern is formed on the substrate such that the pattern is used to define a frame pattern, electrostatic actuators, mirror component, and support structure. Portions of the substrate are removed selectively using the pattern to form the frame pattern, electrostatic actuators, mirror component, and support structure such that the electrostatic actuators define a gap that decreases along a direction perpendicular to a surface of the mirror component.

An electrostatic actuator fabrication method for a MEMS mirror device is described. Two or more shaped fingers are formed from a single substrate. The shaped fingers are formed to define a gap between the fingers that decreases along a direction perpendicular to a top surface of the fingers so that a movable finger may move in an out-of-plane motion.

The methods for fabricating a MEMS mirror device and electrostatic actuators for a MEMS mirror device allow for a large number of mirror devices to be arranged using a single substrate. A single substrate may be used to form the structures for the MEMS mirror device. Furthermore, the methods allow multiple structures to be formed at the same time.

In the following embodiments, a layer can be selectively patterned on a substrate using any combination of a photolithography process, dry or wet etching process, or a liftoff process.

Figure 1:
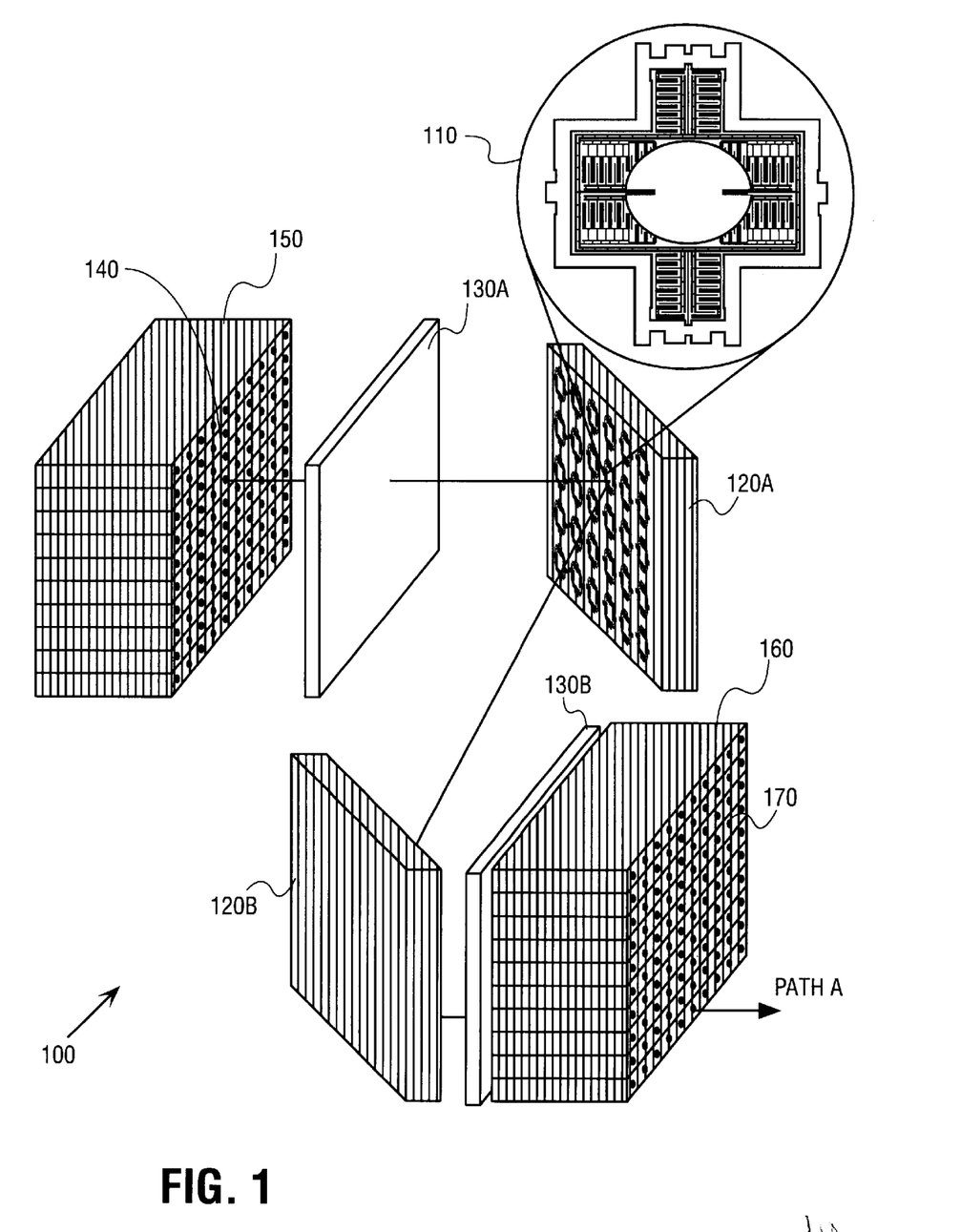
FIG. 1 illustrates an exemplary optical switching system for practicing the invention.

FIG. 1 illustrates an exemplary optical switching system 100 for practicing the invention. For example, optical switching system 100 may represent a 3-dimensional optical switching system. A 3-dimensional optical switching system allows for optical coupling between input fibers and output fibers in different planes using lens arrays and mirror arrays. The lens arrays and mirror arrays provide proper angle and position of light beams traveling from input fibers to output fibers. That is, a light beam must leave and enter a fiber in a direct path. In the following description of FIG. 1, mirror arrays are described as micro-electro-mechanical-system (MEMS) mirror arrays. The MEMS mirror arrays are arrays of microscopic mirror devices formed with a substrate. The mirror devices can redirect beams of light to varying positions.

Referring to FIG. 1, optical switching system 100 includes input fiber array 150, first lens array 130A, first MEMS mirror array 120A, second MEMS mirror array 120B, second lens array 130B, and output fiber array 160.

Input fiber array 150 provides a plurality of optical fibers 140 for transmitting light to first lens array 130A. First lens array 130A includes a plurality of optical lenses (not shown), which are used to direct collimated beams of light from input fiber array 150 to individual MEMS mirror devices on first MEMS mirror array 120A. First MEMS mirror array 120A includes a plurality of electrically addressable MEMS mirror devices such as, for example, MEMS mirror device 110.

MEMS mirror device 110 may be a gimbaled mirror device having a cross shape with an elliptical mirror component. Alternatively, MEMS mirror device 110 may be a gimbaled mirror device having different shapes and configurations. For example, the mirror component may be a circular or rectangular mirror component. First MEMS mirror array 120A may have an array of MEMS mirror device 110 that can pivot a mirror component to redirect or reflect light beams to varying MEMS mirror devices on second MEMS mirror array 120B. Second MEMS mirror array 120B may also include a plurality of MEMS mirror devices such as MEMS mirror device 110, which are used to redirect and reflect light beams to varying lenses on second lens array 130B. Second lens array 130B accepts collimated light beams from second MEMS mirror array 120B and focuses the light beams to individual output fibers 170 of output fiber array 160.

Optical switching system 100 allows light beams from any input fiber 140 of input fiber array 150 to be redirected to any output fiber 170 of output fiber array 160. For example, a light beam following the path "A" is outputted from one input fiber and is redirected using first and second lens arrays 130A and 130B and first and second MEMS mirror arrays 120A and 120B to a different output fiber. The lens and MEMS mirror arrays may also be used in scanning systems, printing systems, display systems, and other systems that require redirecting beams of light.

Figure 2A:
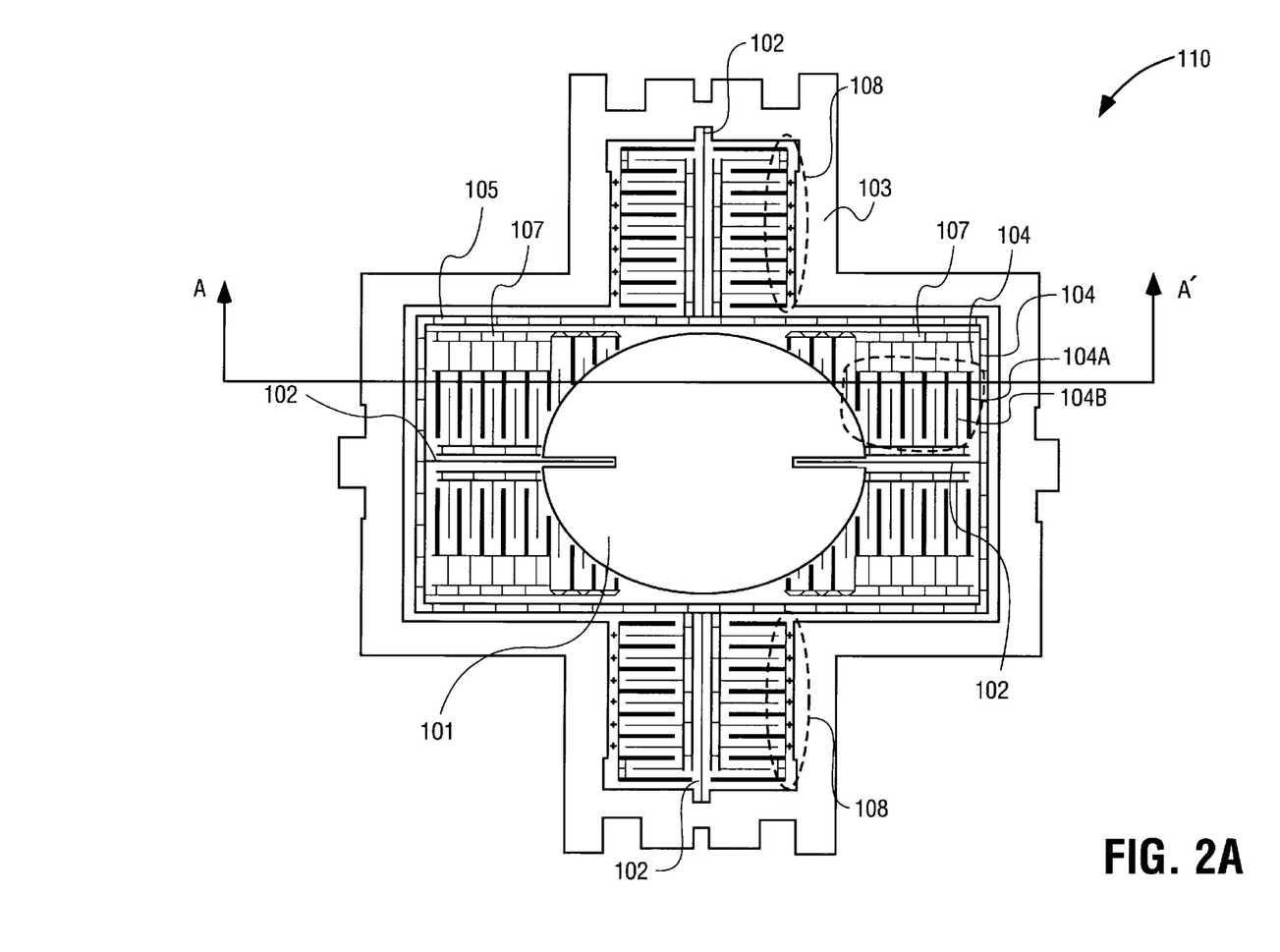
FIG. 2A illustrates a top view of one embodiment of a MEMS mirror device for a MEMS mirror array of FIG. 1.

FIG. 2A illustrates a top view of one embodiment of a MEMS mirror device 110 for a MEMS mirror array of FIG. 1. Referring to FIG. 2A, MEMS mirror device 110 illustrates an elliptical mirror component 101. MEMS mirror device 100 may have different shaped mirror components such as, for example, a rectangular or circular mirror component.

MEMS mirror device 110 includes a frame 105 supporting mirror component 101 and other suspended components. MEMS mirror device 110 also includes shaped combed finger actuators 104 having fixed shaped interdigitated fingers 104A and movable fingers 104B for moving mirror component 101 in an out-of-plane motion, hinges 102 allowing mirror component 101 to pivot, mechanical connector 107 connecting the movable fingers 104B to frame 105, electrical isolation bars 108, and support structure 103 providing support for suspended components, e.g., frame 105, hinges 102, and mirror component 101.

Mirror component 101 is capable of having an angular range of motion with respect to an axis along hinges 102 caused by electrostatic actuation from shaped combed finger actuators 104. Shaped combed finger actuators 104 provide electrostatic actuation for mirror component 101. Actuators 104 are connected with mechanical connector 107, which is connected with frame 105 and mirror component. 101. Electrical isolation bars are disposed adjacent to actuators 104. Frame 105 provides support for mirror component 101. Support structure 103 provides anchor support for suspended structures.

Although not shown in FIG. 2A, MEMS mirror device 110 may also include ground planes, electrodes, and wiring lines, which have not been shown for purposes of clarity.

Figure 2B:
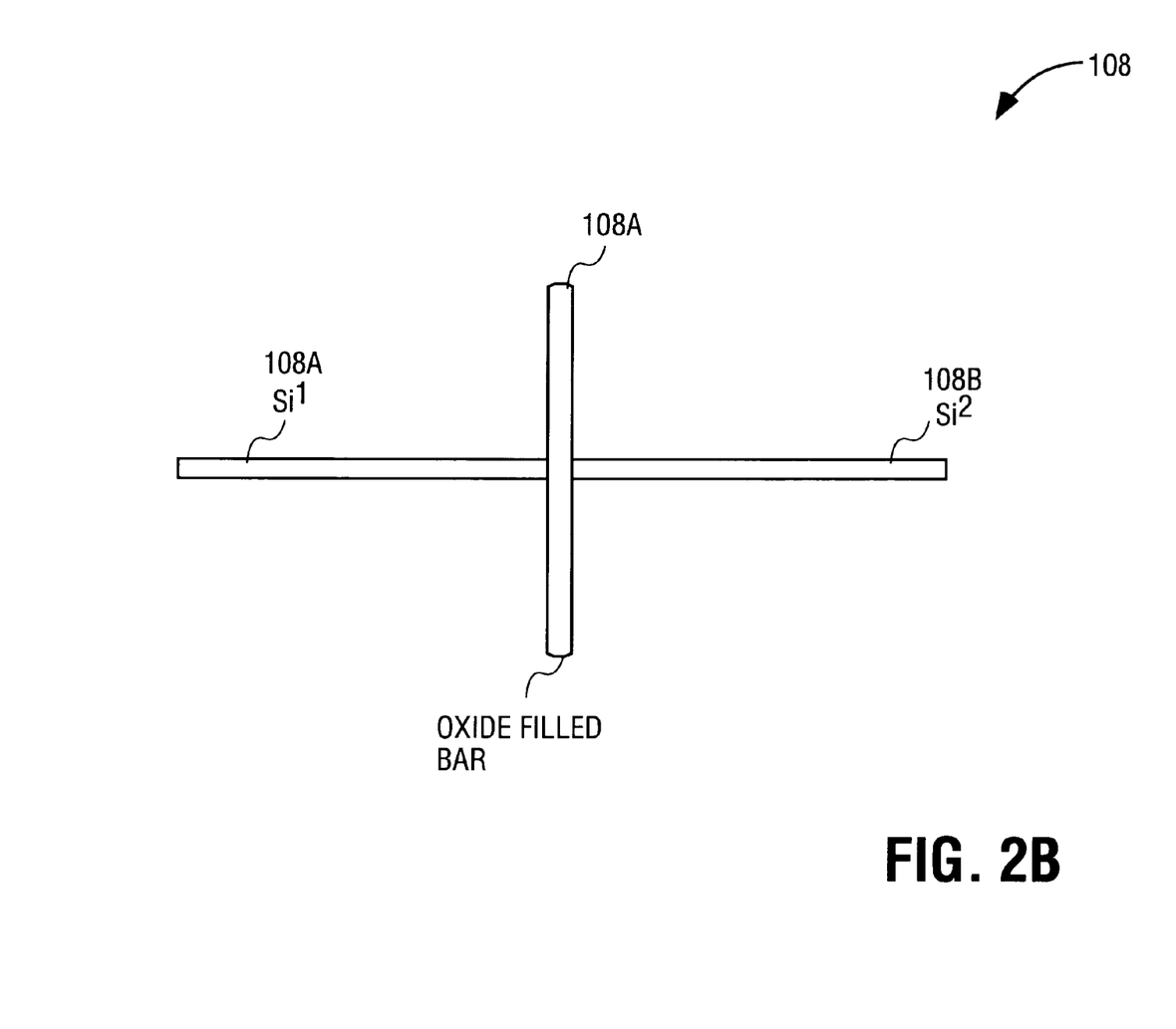
FIG. 2B illustrates a top view of one embodiment of an electrical isolation structure of FIG. 2A.

FIG. 2B is an exploded top view of electrical isolation bars 108 of FIG. 2A. Referring to FIG. 2B, electrical isolation bars 108 include an oxide filled bar 108A separating a first silicon bar 108C (si$^1$) and a second silicon bar 108B (si$^2$). Oxide filled bar 108 electrically isolates first silicon bar 108C and second silicon bar 108B such that multiple voltage potentials can be applied on different locations of suspended structures of mirror device 110.

Figure 3:
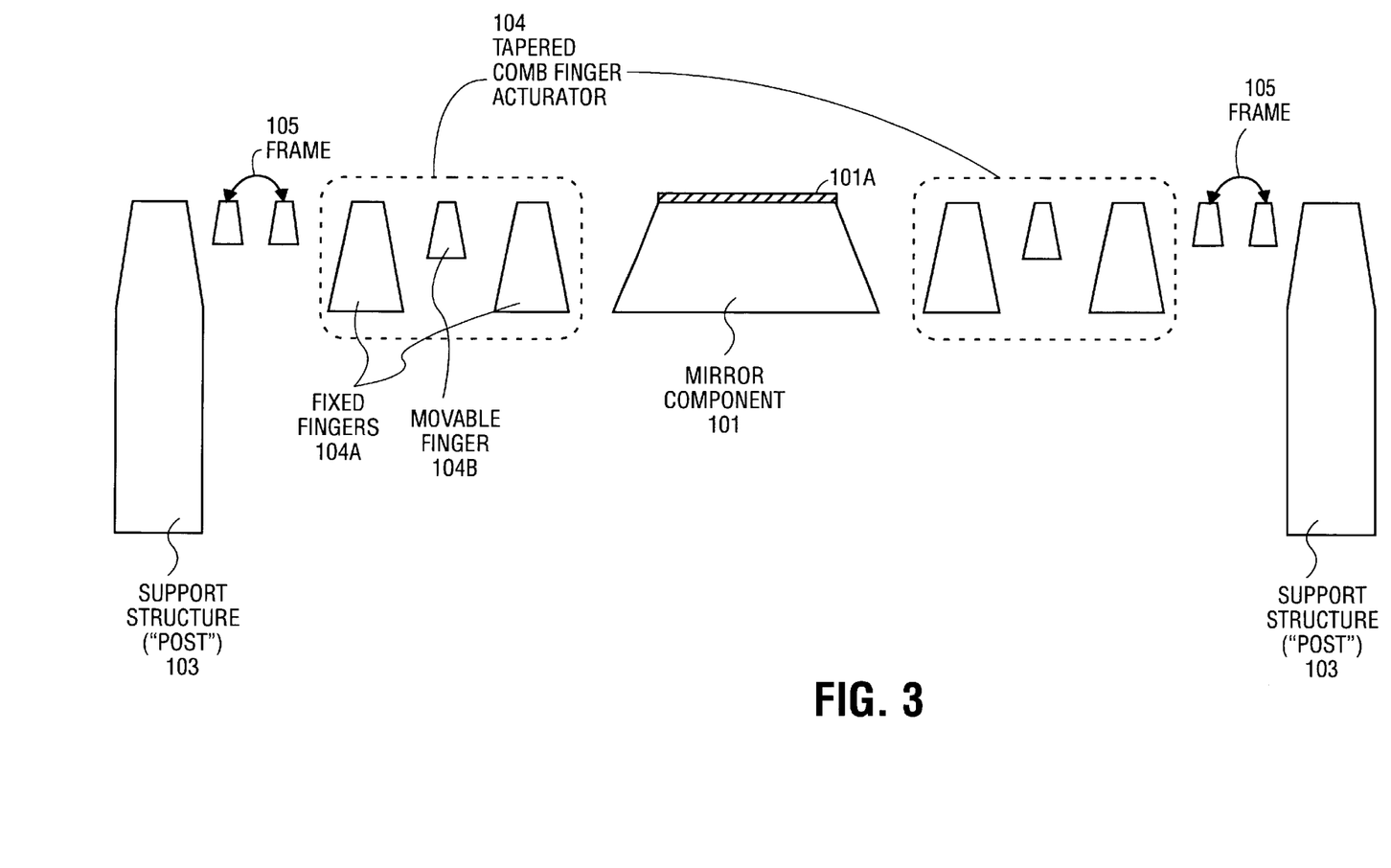
FIG. 3 illustrates a cross-sectional side view showing the structure of one embodiment of a MEMS mirror device taken along the line A–A' of FIG. 2A.

FIG. 3 is a cross-sectional side view showing the structure of one embodiment of a MEMS mirror device taken along the line A–A' of FIG. 2A.

Referring to FIG. 3, the MEMS mirror device includes support structure 103, frame 105, shaped combed finger actuators 104, and mirror component 101 all formed from a single substrate. For example, a single silicon substrate may be used for the structures of the MEMS mirror device. Furthermore, the structure of the MEMS mirror device may be formed using the same process in which the shaped combed finger actuators 104 are formed. In the example of FIG. 3, tapered combed finger actuator are shown. Thus, the structures of the MEMS mirror device are also tapered.

Support structure ("post structure") 103 is formed adjacent to frame 105. Support structure 103 provides anchor support for frame 105 and mirror component 101. Support structure 103 may define varying shapes to provide support for MEMS mirror device 100. For example, support structure 105 may define a cross shape. Frame 105 is formed adjacent to support structure 103 and actuators 104. Frame 105 may also provide anchor support for suspended structures. Frame 105 is formed having multiple components. Alternatively, frame 105 may be formed with a single component. Hinges 102 (not shown) are formed connecting mirror component 101 with frame 105 and support structure 103. Hinges 102 also allows mirror component 101 to pivot and have an angular range of motion.

Mirror component 101 is formed adjacent to actuators 104. A reflective surface 101A may be formed on a top surface of mirror component 101 to reflect and redirect beams of light. For example, reflective surface 101A may be a metal layer having light reflective properties such as, for example, gold Au, aluminum Al, or copper Cu. Alternatively, reflective surface 101A may include multiple layers. For example, reflective surface 101A may have a first metal layer, a support layer formed on the first metal layer, and a second metal layer formed on the support layer. Mirror component 101 may move about an axis with respect to hinges 102 to have an angular range of motion caused by electrostatic actuation from actuators 104.

Electrostatic actuation is caused by a voltage being applied to fixed shaped (e.g., tapered) interdigitated fingers 104A of actuators 104. The voltage applied creates an electric field on movable fingers 104B, which are shorter in height than the fixed shaped interdigitated fingers 104A. Thus, when a voltage is applied to the fixed shaped interdigitated fingers 104A, an out-of-plane electric field is produced on movable fingers 104B causing movable fingers 104B to move in an out-of-plane motion. Because movable fingers 104B are connected with mechanical connector 107 (not shown), a torque is created on frame 105 or mirror component 101 when movable fingers 104B move thereby causing mirror component 101 to pivot with respect to hinges 102. Such a torque allows mirror component 101 to have a large angular range of out-of-plane motion. Consequently, in-plane motion is not allowed due to in-plane symmetry of the electric field.

Figure 4A:
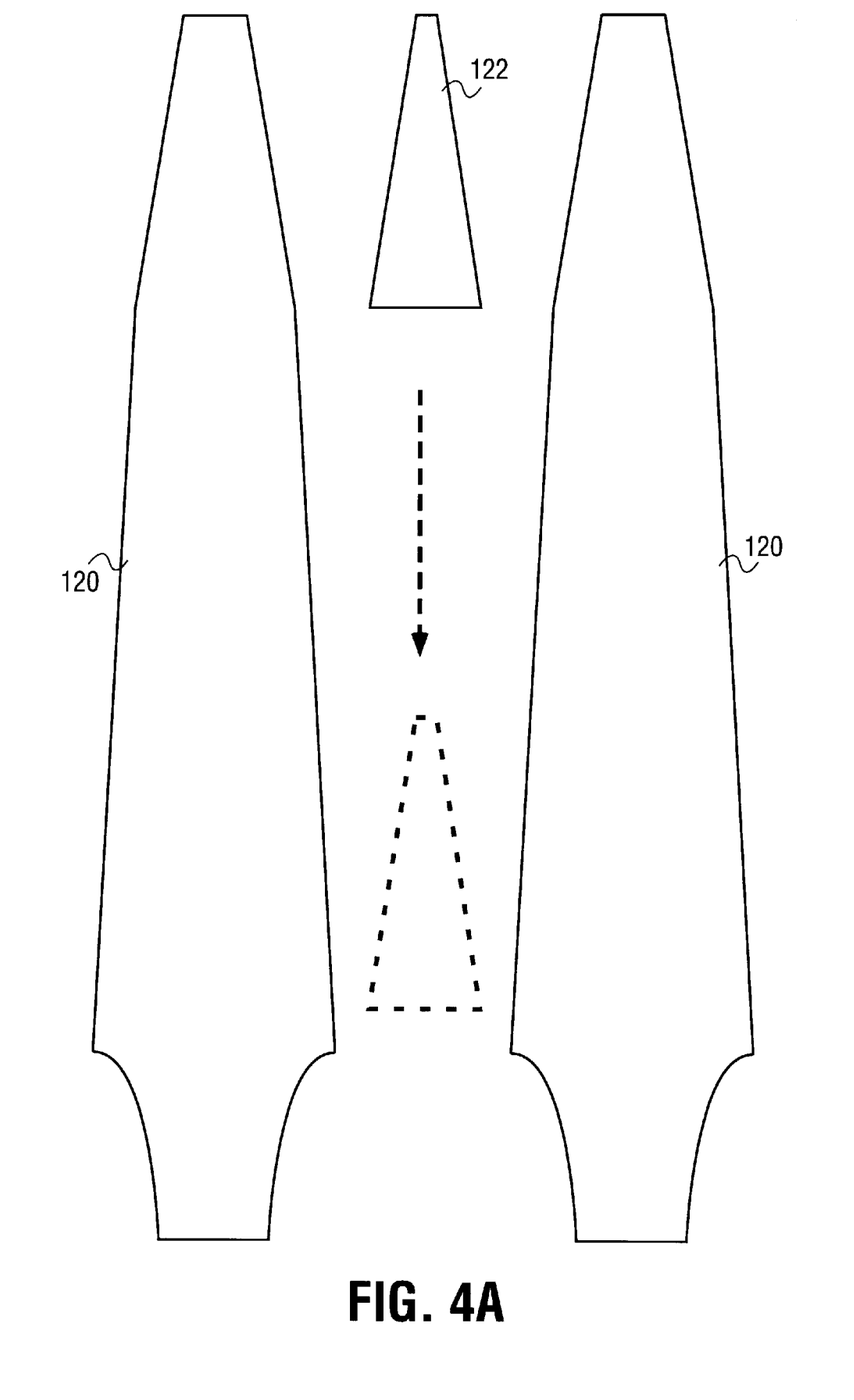
FIG. 4 illustrates an exemplary shaped combed finger actuator for a MEMS mirror device.
Figure 4B:
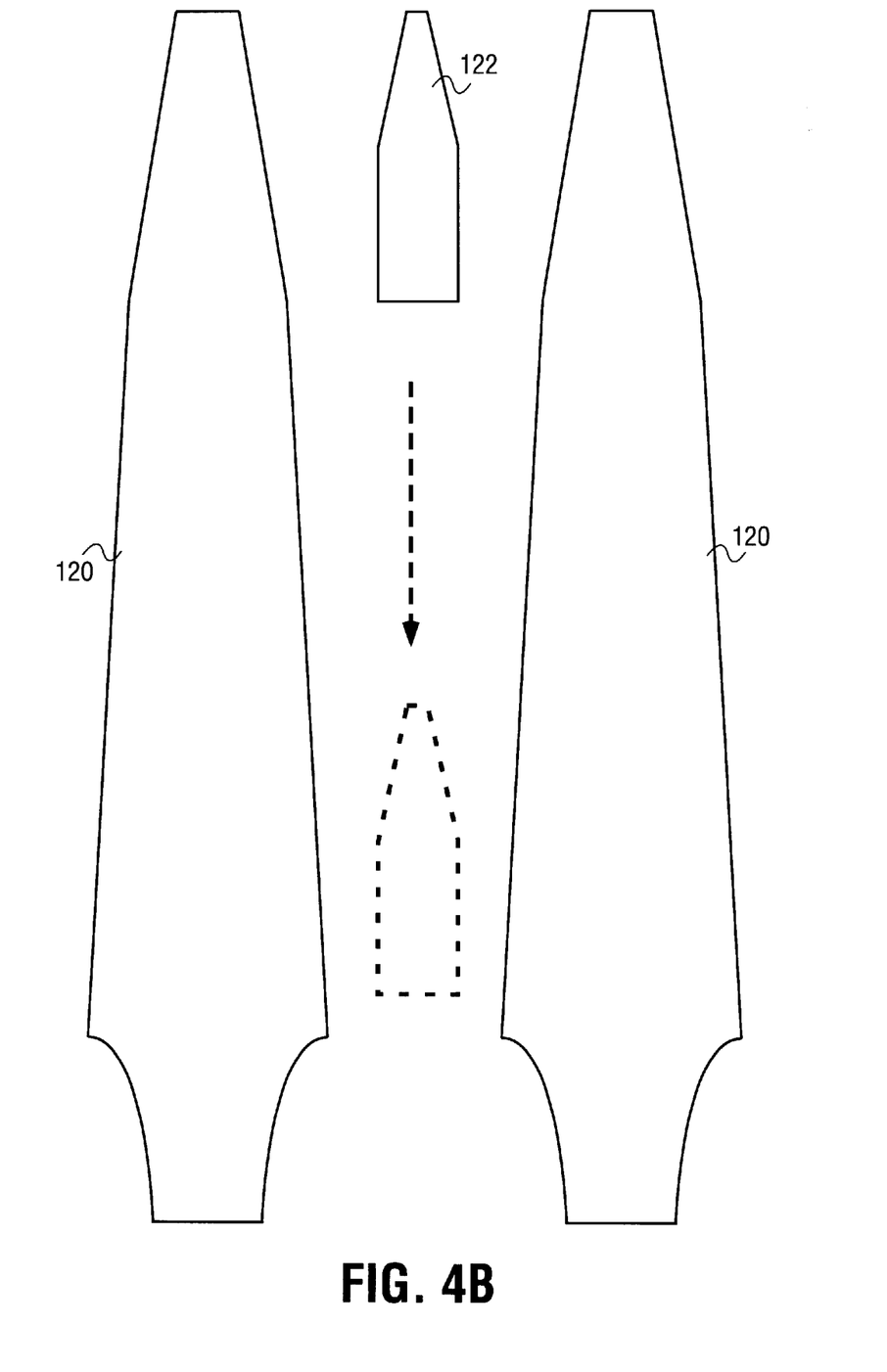

FIG. 4 illustrates an exemplary shaped combed finger actuator 104 for MEMS mirror device 110. For the embodiment described in FIG. 4, the shaped combed finger actuator has substantially tapered fingers.

Referring to FIG. 4, actuator 104 includes fixed shaped interdigitated fingers ("plates") 120 with a movable finger 122 ("movable plate") disposed in between fixed fingers 120. To provide out-of-plane motion, movable finger 122 is shorter than fixed fingers 120. The movable finger 122 may have a shape, which is generally similar to a top portion of fixed fingers 120. For example, movable finger 122 and top portions of fixed fingers 120 may have a triangular shape. Alternatively, movable finger 122 may have a straight sidewall shape.

For one embodiment, fixed fingers 120 are tapered such that a gap between the fixed fingers decreases in a downward direction. By having a gap between the fixed fingers decrease along a downward direction, an electric field created when a voltage is applied to the fixed fingers becomes more intensified as the gap decreases. The intensified electric field creates a stronger force that can be applied to moving finger 122 that causes mirror component 101 to pivot. Consequently, the force that can be created is inversely proportional to the size of the gap. Thus, having a smaller gap between the fixed fingers creates a larger force to move the moving part using a small amount of voltage. The range of motion is beyond the "usual" midpoint of a plate height.

If fixed fingers 120 had a straight wall shape, the gap between the fixed fingers would not decrease in downward direction, and a larger amount of voltage would be required to move the movable fingers due to the decrease in the net electric field as the movable fingers move. Thus, by having a substantially tapered shape, fixed fingers 120 are capable of generating a large vertical force at low operating voltages, thus, allowing the movable finger 122 to travel a longer distance at low operating voltages. Fixed fingers 120 may have other shapes, for example, fixed fingers 120 may have a combination of straight wall and tapered sides such that the fingers define a gap that is substantially decreasing. As a result, because the movable finger can move farther distances, the movable finger is capable of allowing a mirror component for a MEMS mirror device to have a larger range of angular motion.

FIGS. 5A through 5D are cross-sectional side views illustrating a process for fabricating shaped combed finger actuators for a MEMS mirror device 110 according to one embodiment. The following process is able to use a single substrate to form the shaped combed finger actuators.

Figure 5A:
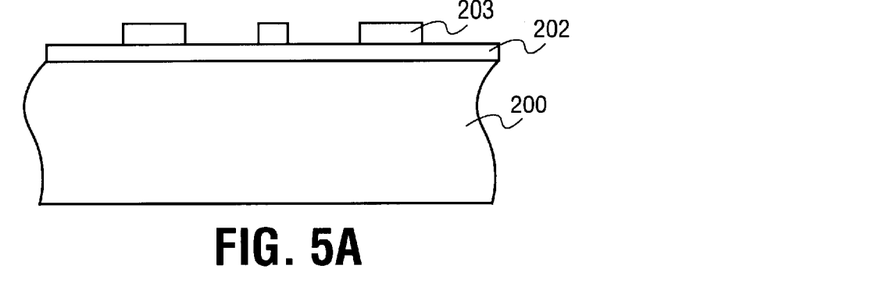
FIGS. 5A through 5D are cross-sectional side views illustrating a process for fabricating shaped combed finger actuators for a MEMS mirror device according to one embodiment.

Referring to FIG. 5A, an oxide layer 202 is formed on a top surface of substrate 200. Substrate 200 may be silicon substrate. Oxide layer 202 may be a polysilicon layer, polymer layer, nitride layer, or other types of protection layer. A photo-resist is then deposited and patterned selectively on oxide layer 202 to form a photo-resist pattern 203. Photo-resist pattern 203 is used to define fixed shaped interdigitated fingers and movable fingers such that the shape of the movable fingers will be narrower than the shape of the fixed fingers. The pattern to define the movable fingers must be narrower than the pattern to define the fixed fingers so that the narrower fingers can be undercut thereby allowing the movable fingers to be shorter than the fixed fingers.

Figure 5B:
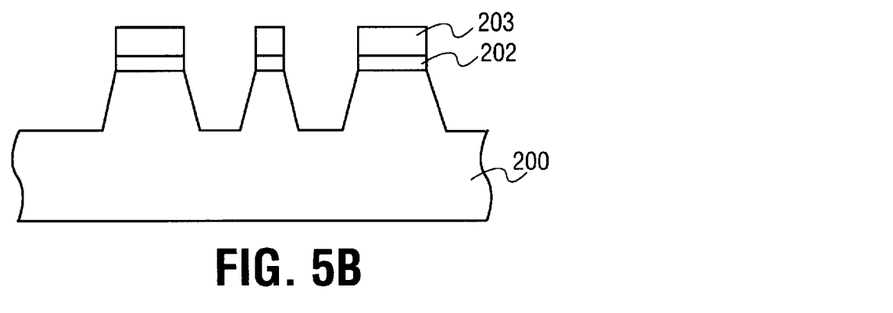

Referring to FIG. 5B, oxide layer 202 and portions of the topside of substrate 200 are etched selectively to form tapered fingers. That is, tapered fingers are fabricated using an etch profile control process. For example, a time controlled deep silicon etching process may be used to control the profile of the fingers. Alternatively, a deep reactive ion etching (RIE) process may be used in varying time intervals.

For the time controlled etching processes, each successive etching interval is shorter in duration than a proceeding interval. As such, the beginning of the time-controlled process provides substantially straight wall etching, and, as each interval decreases, the time-controlled process provides a tapered shape. This process continues to a desired depth in which an undercut etching process is used to release movable finger 205.

Similarly, the profile control may be performed by decreasing selectively other etch parameters such as direct current (DC) bias, RIE power, gas flow rates. Alternatively, profile control may be achieved by increasing the passivation parameters such a deposition time, passivation gas flow. Furthermore, the micro-loading condition of a silicon etch may be used to induce a tapered profile.

Figure 5C:
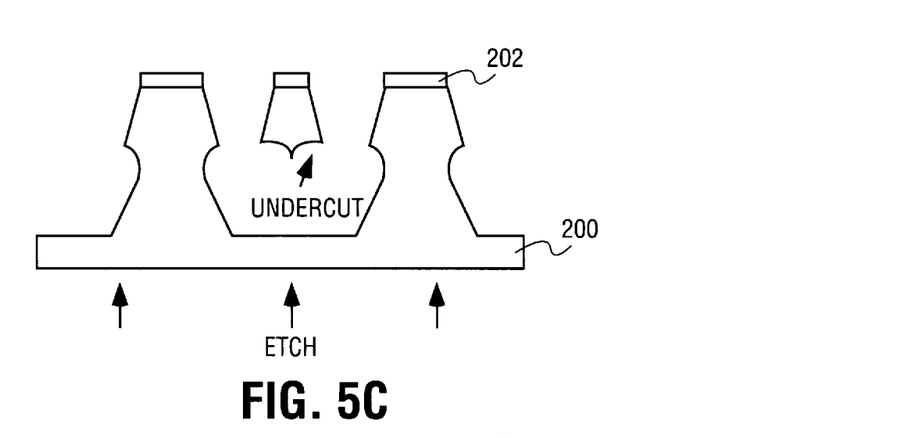

Referring to FIG. 5C, after the profiled etching process, photo-resist pattern 203 is removed or stripped away. An oxide layer (not shown) is then formed on the remaining structure. For example, a plasma chemical vapor deposition (PECVD) oxide layer may be formed on the remaining structure. An undercut etching process is then performed to release moving finger 205. For example, a time controlled RIE etching process may be used to etch the PECVD oxide layer and portions of substrate 200 to undercut and release movable finger 205. Alternatively, a time-controlled wet etch or a dry etching process may be used to undercut finger 205.

Because movable finger 205 is smaller in width than fixed fingers 204, the undercut process does not release fixed fingers 204. The time controlled etching process continues to provide a substantially "tapered" profile after the release. Although fixed fingers 204 have portions removed because of the undercut process on movable finger 205, the removed portions are such that the fixed fingers retain substantially its tapered shape.

Figure 5D:
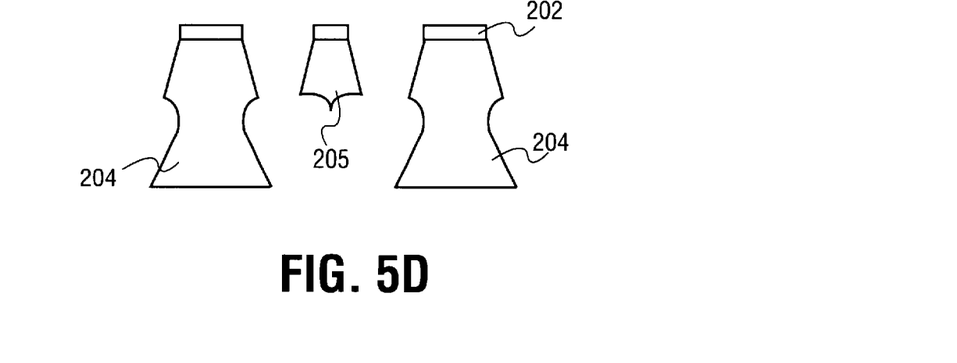

Referring to FIG. 5D, the backside of substrate 200 is etched to clear the floor of substrate 200 to form fixed fingers 204. For example, a deep RIE etching process may be sued to clear the floor of substrate 200. The remaining oxide layer 202 may then be removed using a dry or wet etch process.

The thusly-formed tapered combed finger actuators use a single substrate. The distance at which the movable finger 205 is able to move is dictated simply by the shape and width of the movable finger with respect to the fixed fingers. In addition, the distance at which the movable finger 205 is able to move is also dictated by a thickness of the substrate used. Thus, a method for an electrostatic actuator providing large out-of-plane motion for a mirror component of a MEMS mirror device is provided.

FIGS. 6A through 6D are cross-sectional side views illustrating a process for fabricating a MEMS mirror device according to one embodiment. The following process is able to use a single substrate to form MEMS mirror device structures. The following processing steps are similar to the steps illustrated in FIGS. 5A through 5D.

Figure 6A:
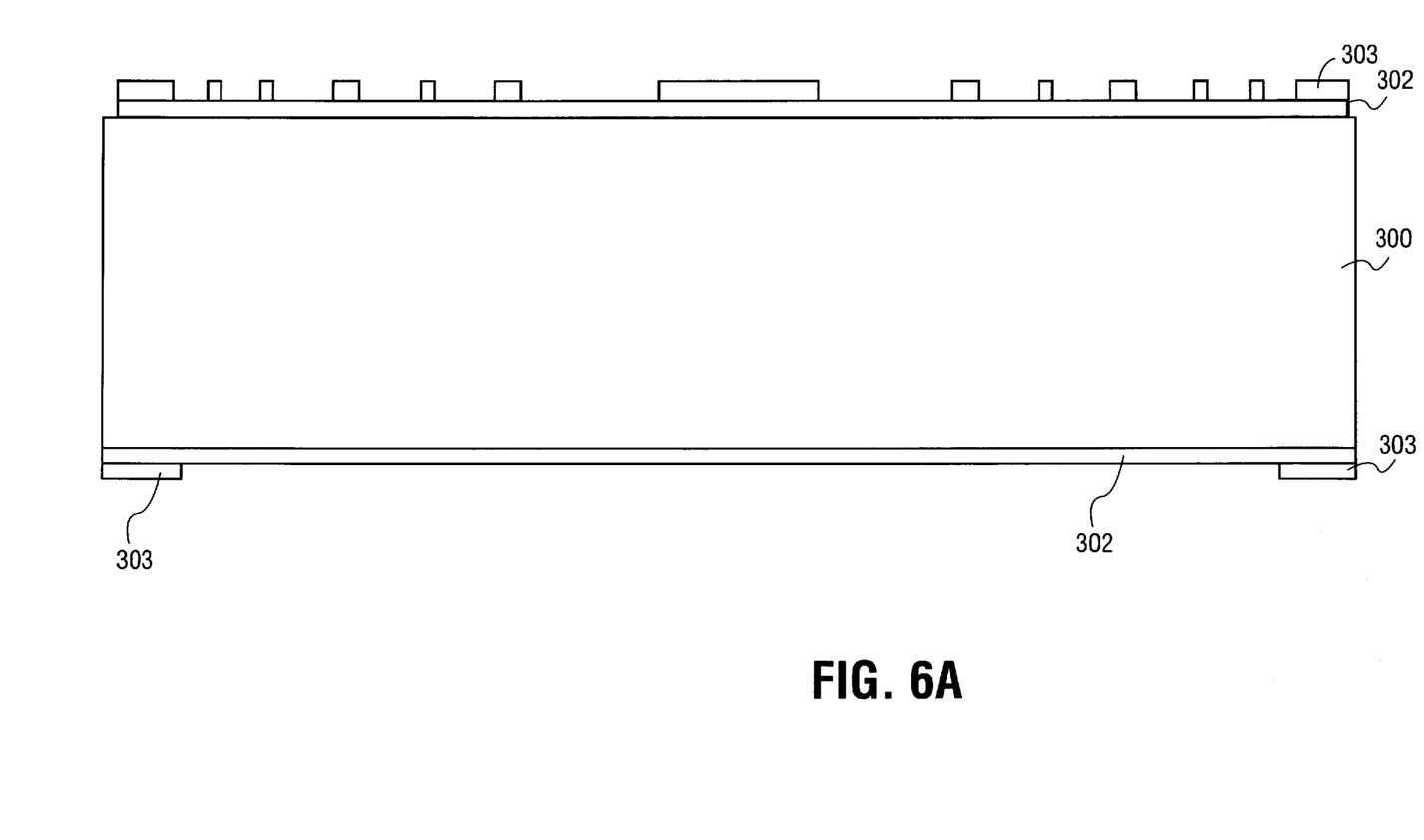
FIGS. 6A through 6D are cross-sectional side views illustrating a process for fabricating a MEMS mirror device having shaped combed finger actuators according to one embodiment.

Referring to FIG. 6A, an oxide layer 302 is formed on a top and bottom surface of substrate 300. Substrate 300 may be silicon substrate. Oxide layer 302 may be a polysilicon layer, polymer layer, nitride layer, or other types of protection layer. A photo-resist is then deposited and patterned selectively on oxide layer 302 to form photo-resist pattern 303 on a top and bottom side of substrate 300. Photo-resist pattern 303 is used to define a support structure, frame pattern, actuators, and mirror components for a MEMS mirror device. Photo-resist pattern 303 may also be used to define other mirror device components such as hinges and other structures.

Because the fixed fingers of the actuators require a substantially tapered shape, the support structure, frame, and mirror component may also have a tapered shape so that the process may be performed at the same time. Alternatively, each structure may be formed individually or in different steps. The following process illustrates structures being formed simultaneously.

Figure 6B:
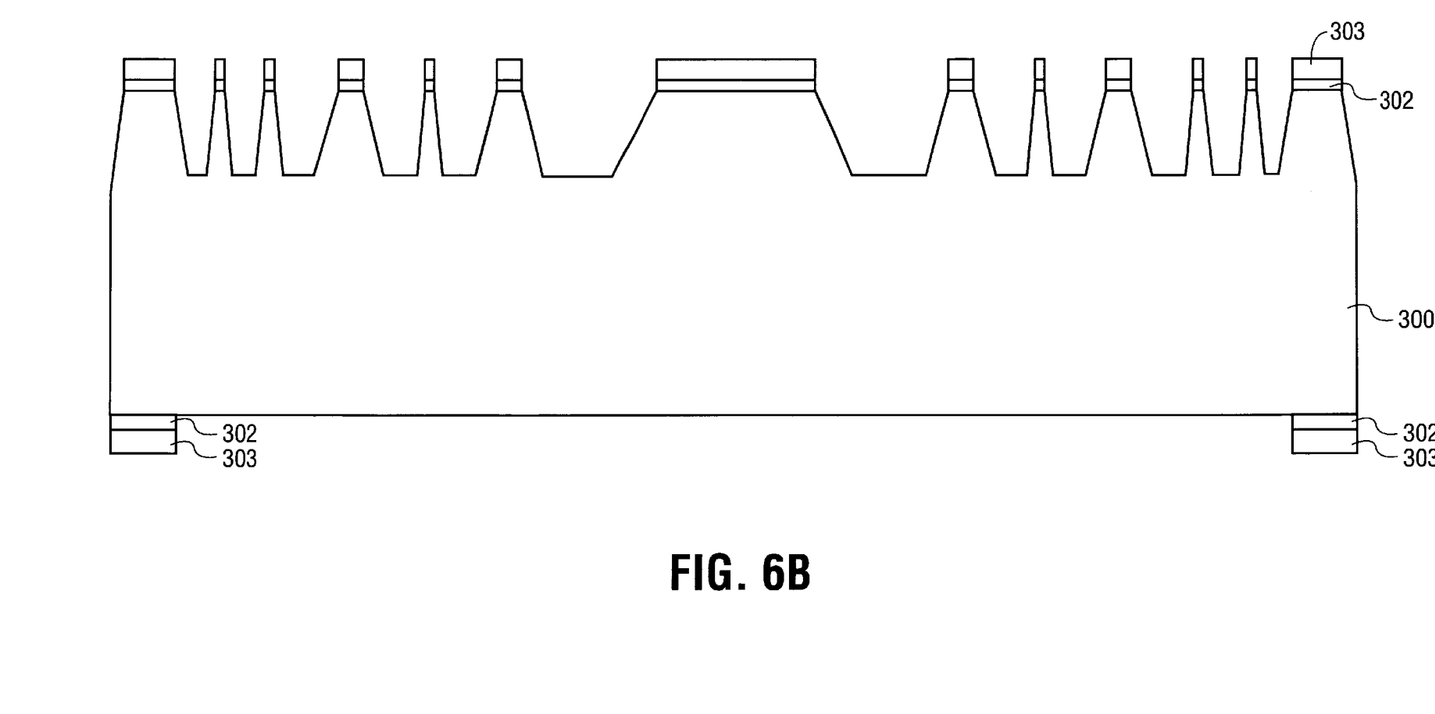

Referring to FIG. 6B, oxide layer 302 and portions of the topside of substrate 300 are etched selectively to form MEMS mirror device structures having a tapered shape. For example, the same profile control fabrication techniques illustrated in FIG. 5B may be used here.

Such fabrication techniques provide a substantially tapered shape for the structures of the MEMS mirror device. This process continues to a desired depth in which an undercut etching process is used to release the movable fingers and frame.

Figure 6C:
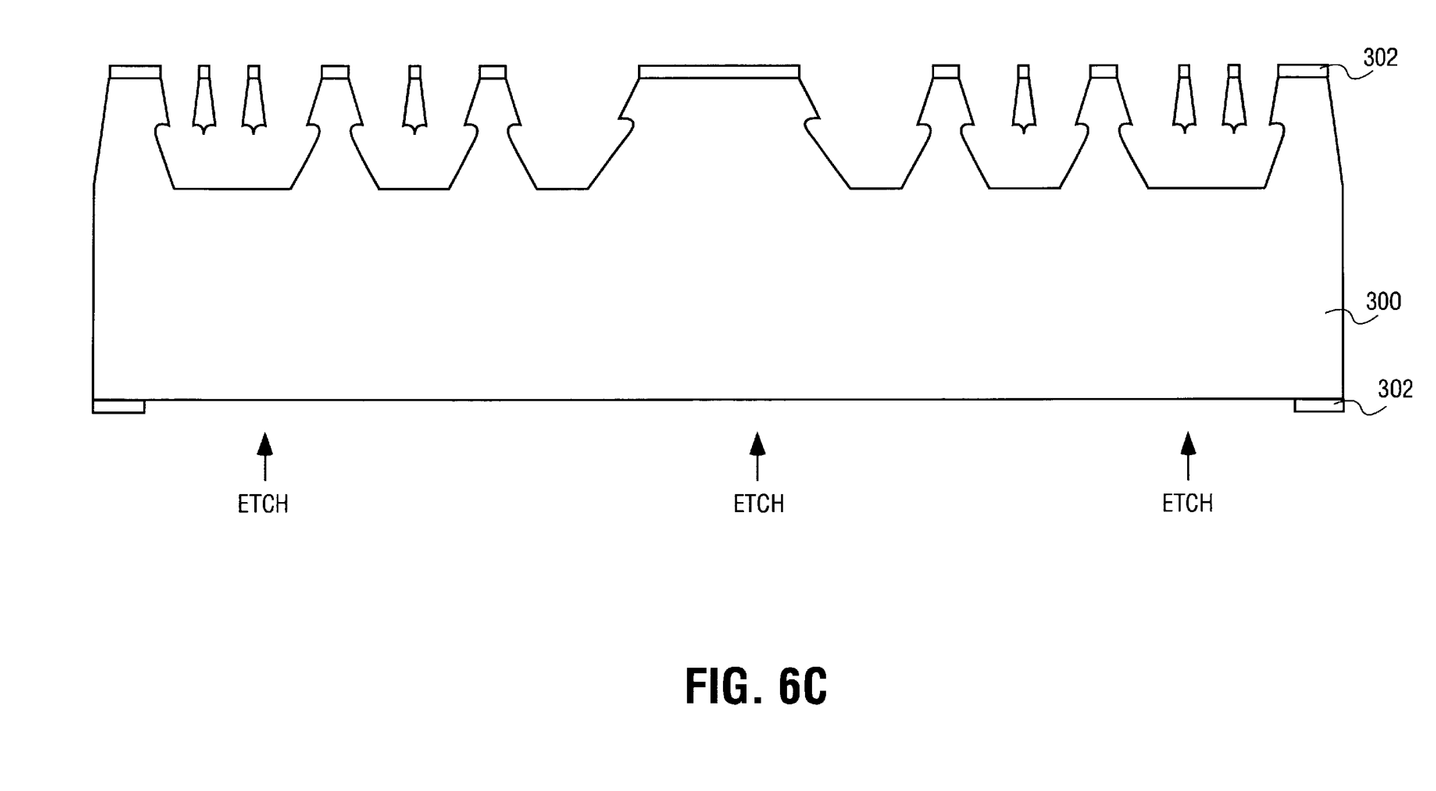

Referring to FIG. 6C, after the time controlled etching process, photoresist pattern 203 is removed or stripped away. An oxide layer (not shown) is then formed on the structure of FIG. 6B. For example, a PECVD oxide layer may be formed on the structure. An undercut etching process is then performed to release the movable fingers and frame. Alternatively, movable fingers and frame may be undercut and released at different times in the process, and not necessarily at the same time. For example, a time controlled RIE etching may be used to etch the PECVD oxide layer and portions of substrate 300 on the topside to undercut and release movable fingers 304B and frame 335. Alternatively, a time controlled wet etch or dry etch process may be used to undercut and release movable fingers 304B and frame 335.

Because the movable finger 334B and frame 335 are smaller in width than fixed fingers 334B, mirror component 331, and support structure 333, the undercut process does not release those structures. Although fixed fingers 334A, mirror component 331, and support structure 333 have portions removed because of the undercut process, fixed fingers 334A, mirror component 331, and support structure 333 retain substantially a tapered shape.

Figure 6D:
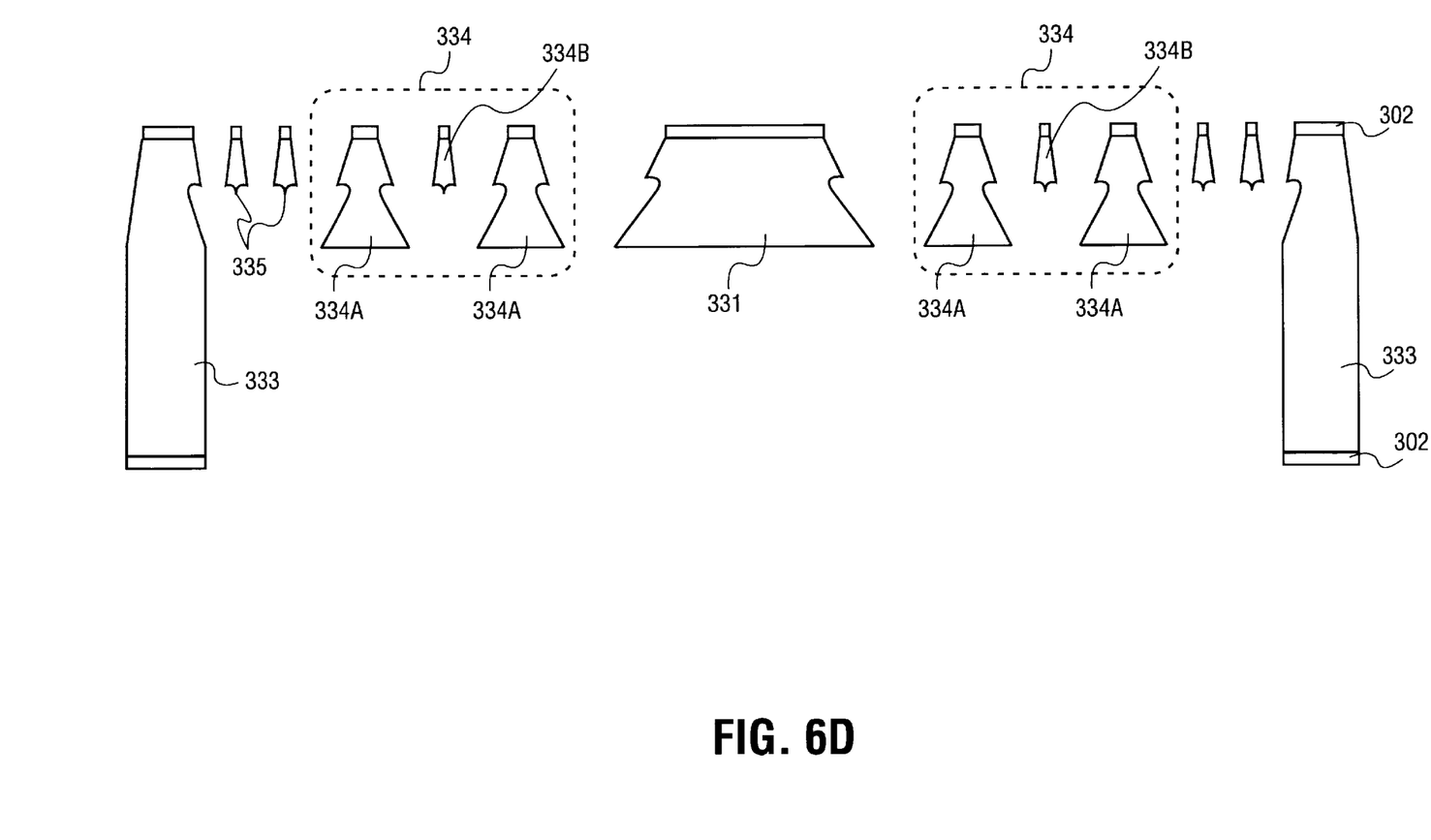

Referring to FIG. 6D, the backside of substrate 300 is etched to clear the floor and of substrate 300 and form support structure 333, fixed fingers 333A, and mirror component 331. For example, a deep RIE etching process may be used to clear the floor of substrate 300. Oxide layer 302 may then be removed using a dry or wet etch process. In alternative embodiments, the backside of substrate 300 may be etched first in the process to a desired depth, and the floor of substrate 300 may be cleared during the time controlled etching process.

After oxide layer 302 is removed from mirror component 331, a reflective material may be formed on mirror component 331 to reflect and redirect light beams. For example, a metal layer such as gold Au, aluminum Al, or copper Cu may be formed on mirror component 331. Alternatively, multiple layers may be formed on mirror component 331 to provide a reflective surface.

Although not illustrated, other components and structures may be formed using the above process. For example, hinges may be formed in a similar manner as frame 335. Furthermore, other structures may be formed for the MEMS mirror device, which have not been illustrated for purposes of explanation. For example, ground and electrical lines that provide voltage to the fixed fingers may be formed using standard IC techniques.

The thusly-formed MEMS mirror device uses a single silicon substrate to form MEMS mirror device structures. Furthermore, the structures for the MEMS mirror devices may be formed simultaneously while forming tapered combed finger actuators.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A micro-electro-mechanical-system (MEMS) mirror device, comprising:
   a mirror component that is capable of moving upon electrostatic actuation;
   one or more electrostatic actuators providing electrostatic actuation for the mirror component, the electrostatic actuators having fixed plates disposed approximately perpendicular to the mirror component, the fixed plates being disposed to define a gap between the fixed plates that decreases along a direction perpendicular to a surface of the mirror component, and
   one or more movable plates to move relative to at least one or more of the fixed plates.

2. The MEMS mirror device of claim 1, wherein at least one of the movable plates has a different height than the fixed plates.

3. The MEMS mirror device of claim 2, wherein all of the movable plates have a different height than the fixed plates.

4. The MEMS mirror device of claim 3, wherein the movable plates have a shorter height than the fixed plates.

5. The MEMS mirror device of claim 4, wherein the fixed plates have a substantially tapered shape.

6. The MEMS mirror device of claim 1, wherein the mirror component is capable of having an angular range of motion with respect to two axis.

7. The MEMS mirror device of claim 6, wherein the mirror component is capable of having an angular range of motion of 20 degrees with respect to two axis.

8. An electrostatic actuator for a MEMS mirror device, comprising:
   two or more tapered fingers; the tapered fingers having a gap between the fingers such that the gap decreases along a direction perpendicular to a top surface of the fingers; and
   one or more movable fingers disposed in between the two or more tapered fingers.

9. The electrostatic actuator of claim 8, wherein the two or more tapered fingers are fixed fingers.

10. The electrostatic actuator of claim 8, wherein the one or more movable fingers have a different height than the two or more tapered fingers.

11. The electrostatic actuator of claim 10, wherein the one or more movable fingers have a shorter height than the two or more tapered fingers.

* * * * *